(12) United States Patent
Takenaka et al.

(10) Patent No.: US 7,105,277 B2
(45) Date of Patent: Sep. 12, 2006

(54) PRINTING PLATE, CIRCUIT BOARD AND METHOD OF PRINTING CIRCUIT BOARD

(75) Inventors: Toshiaki Takenaka, Kyoto (JP); Toshihiro Nishii, Osaka (JP); Hideaki Komoda, Osaka (JP); Toshikazu Kondo, Osaka (JP); Shinji Nakamura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 112 days.

(21) Appl. No.: 10/490,482

(22) PCT Filed: Sep. 19, 2003

(86) PCT No.: PCT/JP03/11999

§ 371 (c)(1),
(2), (4) Date: Mar. 23, 2004

(87) PCT Pub. No.: WO2004/028823

PCT Pub. Date: Apr. 8, 2004

(65) Prior Publication Data

US 2004/0248041 A1    Dec. 9, 2004

(30) Foreign Application Priority Data

Sep. 24, 2002    (JP) .............................. 2002-277011
Sep. 25, 2002    (JP) .............................. 2002-278752

(51) Int. Cl.
*G03F 7/00*    (2006.01)
*G03F 7/20*    (2006.01)

(52) U.S. Cl. ........................... 430/302; 430/311; 430/5

(58) Field of Classification Search ................ 430/302, 430/311, 5
See application file for complete search history.

(56) References Cited

U.S. PATENT DOCUMENTS

| | | | | |
|---|---|---|---|---|
| 5,168,805 A | * | 12/1992 | Kasanami et al. | 101/128.21 |
| 5,373,786 A | * | 12/1994 | Umaba | 101/127 |
| 5,476,039 A | * | 12/1995 | Hiruta et al. | 101/123 |
| 5,746,127 A | | 5/1998 | Fischbeck et al. | |
| 2002/0166505 A1 | | 11/2002 | Hirakami et al. | |

FOREIGN PATENT DOCUMENTS

| | | |
|---|---|---|
| EP | 0 956 952 A1 | 11/1999 |
| EP | 1 167 029 A1 | 1/2002 |
| JP | 57-103862 | 6/1982 |
| JP | 5-338369 A | 12/1993 |
| JP | 6-268345 A | 9/1994 |
| JP | 7-106760 A | 4/1995 |
| JP | 7-111374 A | 4/1995 |
| JP | 2001-213064 A | 8/2001 |
| WO | WO 01/56793 A | 8/2001 |

* cited by examiner

*Primary Examiner*—Amanda Walke
(74) *Attorney, Agent, or Firm*—McDermott Will & Emery LLP

(57) ABSTRACT

The present invention aims to provide a printing plate capable of preventing paste of high viscosity adhering to an edge of a squeegee from being transferred to and left on a through hole of a printed circuit board when the paste is being filled by a squeegeeing method. The printing plate has a metal sheet (3) provided with a squeegee cleaning section (7) formed thereon and fixed to the back surface of a slanting area (5) of mask (2) attached to a plate framework (1). The through hole of the printed circuit board is filled with paste only after paste of high viscosity adhering to the edge of the squeegee is removed by the squeegee cleaning section (7), to prevent the paste from being left on the through hole, and thereby achieving the printed circuit board of excellent quality.

25 Claims, 11 Drawing Sheets

Squeegee forward moving direction

Squeegee forward moving direction

PRINTING PLATE, CIRCUIT BOARD AND METHOD OF PRINTING CIRCUIT BOARD

TECHNICAL FIELD

The present invention relates to a printing plate used for patterning and filling through holes in a two-sided, multi-layered or the like printed board with a paste. The invention also relates to a printed board used for a variety of electronic devises, and a printing method for the printed board using the printing plate.

BACKGROUND ART

With the advancement of electronic devices in size reduction and high-density packaging, there has been a strong demand in recent years for multi-layering of printed circuit boards not only in the field of industrial electronics but also in the field of consumer electronics.

For such printed circuit boards, it is indispensable to newly develop methods of joining inner via-holes between multilayered circuit patterns in addition to highly reliable structures. Therefore, certain methods have been proposed for manufacturing printed circuit boards of new structures and high-density packaging in which inner via-holes are joined with electrically conductive paste.

One of such conventional methods of manufacturing two-sided printed circuit boards will now be described hereinafter. FIG. 13A through FIG. 13F are cross-sectional views of a printed circuit board showing the production steps in the conventional manufacturing method, FIG. 14 a perspective view showing a plate framework of the prior art provided with a mask having an opening, FIG. 15 a longitudinal sectional view of the same plate framework provided with the mask having the opening, FIG. 16A through FIG. 16G cross-sectional views of a prepreg sheet showing the production steps for filling it with paste by the squeegeeing method, and FIG. 17 a cross-sectional view of a part of a printed circuit board which is being filled with paste.

In FIG. 13A through FIG. 13F, prepreg sheet 21 has a size of 300 mm by 500 mm and a thickness of approximately 150 μm, for example. Prepreg sheet 21 used here may be a board material of composite prepared by having an unwoven fabric formed of all-aromatic polyamide fibers impregnated with a thermosetting epoxy resin. Mask films 22a and 22b have a Si-based mold release layer formed into a thickness of 0.01 μm or less on each of their surfaces to be bonded to prepreg sheet 21. Each of mask films 22a and 22b has a total thickness of about 16 μm, and that a plastic film of 300 mm in width made of such material as polyethylene terephthalate may be used.

A method proposed here for adhesion between prepreg sheet 21 and mask films 22a and 22b uses a laminating apparatus which melts the resin content of prepreg sheet 21 and bonds it continuously to mask films 22a and 22b. Through holes 23 are filled with conductive paste 24 for making electrical connections with metal foils 25a and 25b of 35 μm in thickness made of copper, for instance, placed on both surfaces of prepreg sheet 21.

In the process of manufacturing the printed board, these through holes 23 are formed in predetermined locations of mask films 22a and 22b bonded to the both surfaces of prepreg sheet 21 by using laser beam machining or the like method, as shown in FIG. 13B.

Through holes 23 are then filled with conductive paste 24 as shown in FIG. 13C. Filling of conductive paste 24 may be made with such a method that prepreg sheet 21 having through holes 23 is placed on stage 6 (shown in FIG. 16A to FIG. 16G, as will be described later) of an ordinary printing machine (not shown in FIG. 13), and conductive paste 24 is filled directly over mask film 22a by reciprocating alternately two squeegees made of such a material as polyurethane rubber. In this process, mask films 22a and 22b on prepreg sheet 21 act individually as print masks, and they also serve as means for preventing the surfaces of prepreg sheet 21 from getting contaminated.

Description is provided further of the method of filling conductive paste 24 by referring to FIG. 14, FIG. 15, and FIG. 16A through FIG. 16G.

The squeegeeing method is used for filling of conductive paste 24. Since prepreg sheet 21 has exclusive mask films 22a and 22b, plate framework 1 of plate 10 for printing is provided with mask 2 made of an approx. 3 mm thick stainless steel having opening 4 measuring 250 mm by 450 mm, which is larger than an effective paste-filling area of prepreg sheet 21, as shown in FIG. 14 and FIG. 15.

To begin with, in preparation of filling conductive paste 24, prepreg sheet 21 formed with through holes 23 is placed on stage 6 of a printing machine (not shown), and mask 2 is set on top of them, as shown in FIG. 16A.

Next, between two squeegees, i.e., moving-forth squeegee 8a and moving-back squeegees 8b disposed above mask 2 in a manner to move forward and backward freely and to pressurize vertically, moving-forth squeegee 8a is lowered to a predetermined position on mask 2 and it is moved forward while pushing a drop of conductive paste 24 to roll about with a pressure.

Then, moving-forth squeegee 8a is advanced to pass over edge 5b of the opening of mask 2, and to reach on top of prepreg sheet 21, as shown in FIG. 16B. Both moving-forth squeegee 8a and moving-back squeegee 8b have the function of moving up and down freely with respect to position of prepreg sheet 21 while maintaining the pressure.

Subsequently, after moving-forth squeegee 8a sweeps over prepreg sheet 21 and the other slanting area and stops at another predetermined position on mask 2, it is raised and let conductive paste 24 drop naturally, as shown in FIG. 16C.

Next, only moving-back squeegee 8b is lowered to a predetermined position on mask 2 as shown in FIG. 16D. Afterwards, moving-back squeegee 8b is moved to sweep over mask 2 and prepreg sheet 21 in the like manner as moving-forth squeegee 8a, as shown in FIG. 16E to FIG. 16G, and this completes the filling of through holes 23 with conductive paste 24.

Mask films 22a and 22b are then removed from both surfaces of prepreg sheet 21, as shown in FIG. 13D. Next, metal foils 25a and 25b made of such material as copper are placed on both surfaces of prepreg sheet 21, as shown in FIG. 13E.

Prepreg sheet 21 in the above state is compressed to thickness "t2"(approx. 100 μm) as shown in FIG. 13F by subjecting it to a thermal compression. This process also bonds metal foils 25a and 25b with prepreg sheet 21. Consequently, metal foils 25a and 25b on the both surfaces are connected electrically via conductive paste 24 filled in through holes 23 provided in the predetermined locations.

Metal foils 25a and 25b are then etched selectively to form a prescribed circuit pattern (not shown in FIG. 13F), to obtain a two-sided printed board.

However, the above paste-filling technique of the prior art has a problem peculiar to it as shown in FIG. 17. That is, if conductive paste 24 has comparatively high viscosity, moving-back squeegee 8b presses conductive paste 24 against the surface of prepreg sheet 21 when it is lowered along edge 5b of the opening of mask 2 at the start of printing. This pushes out a resin content of the conductive paste 24 around the edge of moving-back squeegee 8b, and causes conductive paste 24 of high viscosity to adhere onto the entire area of the edge surface of moving-back squeegee 8b.

When any of the squeegees bearing conductive paste 24, especially moving-back squeegee 8b, first passes over through holes 23 formed in prepreg sheet 21, moving-back squeegee 8b tends to leave hard paste on top of these through holes 23 across the entire filling width of the paste in its moving direction. It thus gives rise to a problem that a part of conductive paste 24 transfers to mask film 22a when mask films 22a and 22b are removed, and adversely influences quality of the product.

Prior art documents hitherto known as being relevant to the present invention include Japanese Unexamined Patent Publications, Nos. H06-268345, H07-106760 and 2001-213064, for instance.

DISCLOSURE OF THE INVENTION

In order to overcome the above problem, a printing plate, a printed board and a method of filling paste according to this invention comprise the step of removing paste of high viscosity adhering to an edge of a squeegee by moving the squeegee to pass through a squeegee cleaning section provided on the printing plate before the squeegee sweeps over a through hole of the printed board product. The invention can thus provide the printed board of outstanding quality.

To overcome the above problem, the printing plate of this invention has a frame-shaped opening which covers generally all or a part of the outer periphery of a circuit board material, and a metal sheet attached to each of locations on back surfaces of slanting areas and two other sides of the opening in a manner that they extend by a predetermined amount. At least one metal sheet attached to one of the slanting areas is provided with a projection at a predetermined location on the upper surface of the extended portion. The projection can remove paste of high viscosity built up on the edge of the squeegee when it passes over the slanting area, and avoid the hard paste from being left on the through hole of the product (printed board). This structure has an advantage of excluding the possibility of adverse effect to the quality due to the paste, a portion of which may be transferred to a mask film when the mask film is removed, and thereby it can provide the printing plate useful for achieving this printing method of high paste-filling quality.

Moreover, the printing method according to this invention is a method of printing paste on a material to be printed, by reciprocating the squeegee, wherein the projection on the printing plate is used to remove paste adhering to the edge of the squeegee before start of the printing. This method can thus remove the paste of high viscosity built up on the edge of the squeegee when it passes over the slanting area, and avoid the hard paste from being left on the through hole of the product. The method has an advantage of excluding the possibility of adverse effect to the quality due to the paste, a portion of which may be transferred to the mask film when the mask film is removed, and thereby it can provide the printing method for achieving high paste-filling quality.

Furthermore, to accomplish the above object, a printed board and a method of printing on the printed board according to this invention comprise the step of forming a squeegee cleaning section in a board material having mask films on both surfaces prior to filling a through hole provided in the board material with conductive paste by the squeegeeing method, wherein the squeegee cleaning section comprises any of un-penetrated holes and through holes with raised brims formed by laser beam machining in a linear or zigzag pattern and a non-penetrated groove formed by a cutting blade into a linear or zigzag pattern located in a predetermined area in an unusable portion or the outside of a product area but within a printable space of the circuit board material.

As a result, the cleaning section can remove the paste of high viscosity built up on the edge of the squeegee before the through hole is filled with the paste, and avoid the hard paste from being left on the through hole of the product. This structure thus has an advantage of excluding the possibility of adverse effect to the quality due to the paste, a portion of which may be transferred to the mask film when the mask film is removed, and thereby it can provide the printing method of achieving high paste-filling quality.

DETAILED DESCRIPTION OF THE PREFERRED EMBODIMENTS

Referring to the accompanying drawings, description will be provided hereinafter of the preferred embodiments of the present invention.

First Exemplary Embodiment

Description is now provided of a method of filling paste and a plate used for the filling process.

Figure 1:
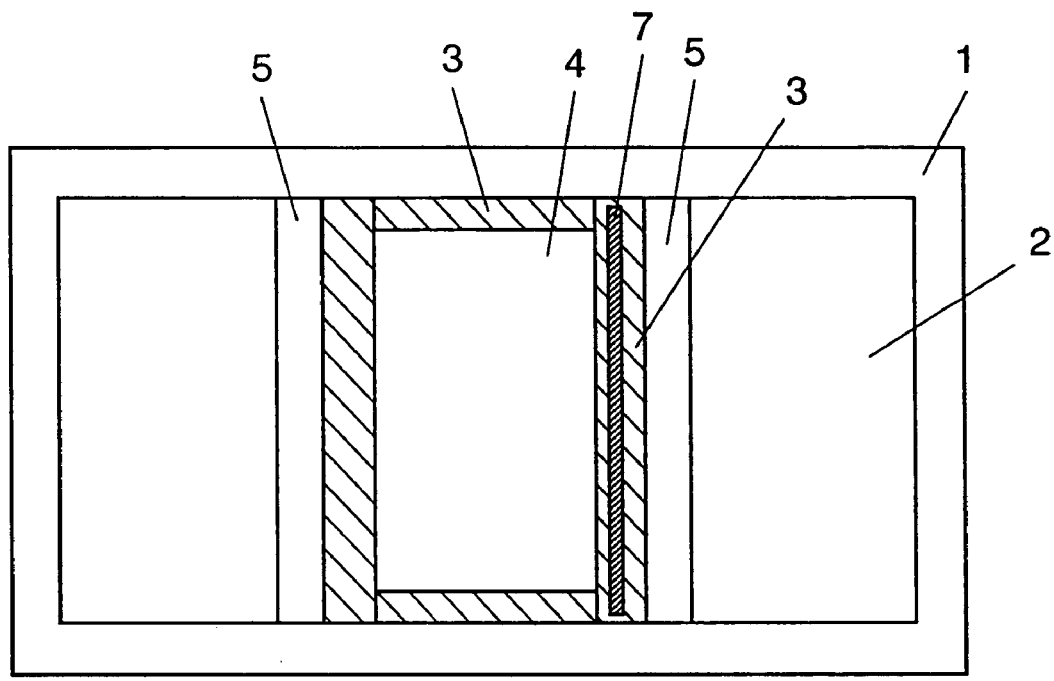
FIG. 1 is a plan view of a printing plate according to the present invention.
Figure 2:
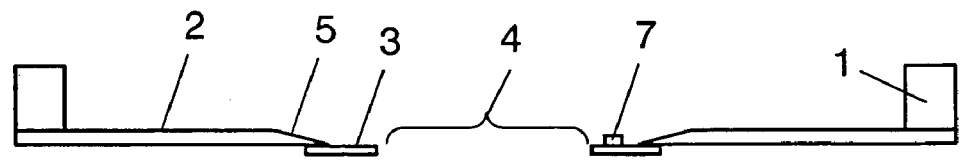
FIG. 2 is a longitudinal sectional view of the printing plate according to the present invention.

FIG. 1 is a plan view of a printing plate according to the present invention, and FIG. 2 is a longitudinal sectional view of the printing plate of the present invention.

Figure 3A:
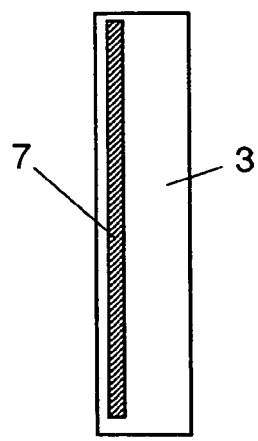
FIG. 3A through FIG. 3C are illustrations showing individually first metal sheets according to the present invention.
Figure 3B:
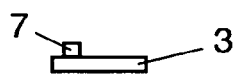
Figure 3C:
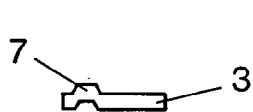

FIG. 3A through FIG. 3C are illustrations individually showing first metal sheets according to the present, wherein FIG. 3A is a plan view and FIGS. 3B and 3C are cross-sectional views of them.

Figure 4A:
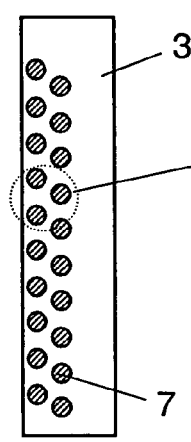
FIG. 4A through FIG. 4C are illustrations showing individually different views of a second metal sheet according to the present invention.
Figure 4C:
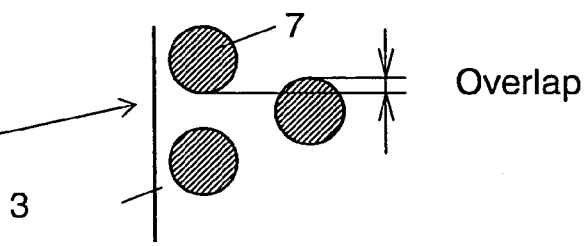
Figure 4B:

FIG. 4A through FIG. 4C are illustrations showing individually different views of a second metal sheet according to the present invention, wherein FIG. 4A is a plan view, FIG. 4B is a cross-sectional view and FIG. 4C is an enlarged plan view of the same.

Figure 5A:
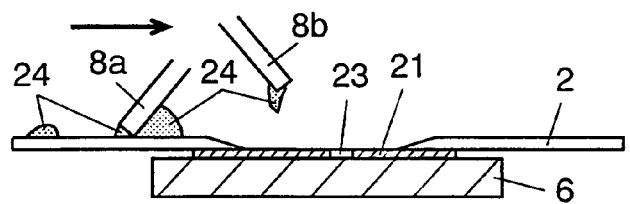
FIG. 5A through FIG. 5G are cross-sectional views of a printed board showing production steps for filling it with paste by a squeegeeing method according to the present invention.
Figure 5B:
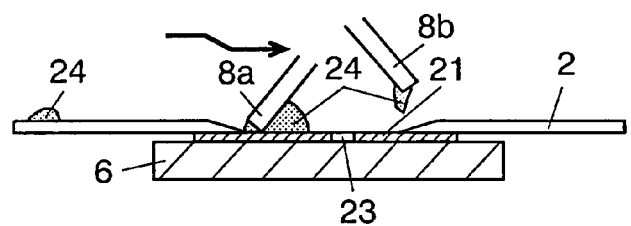
Figure 5C:
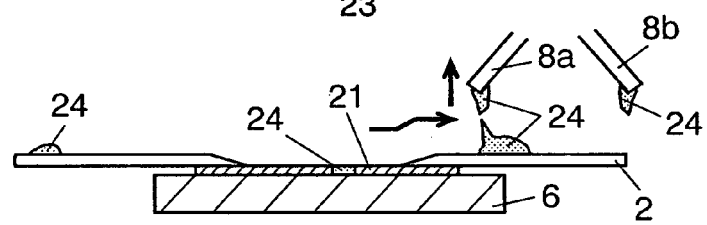
Figure 5D:
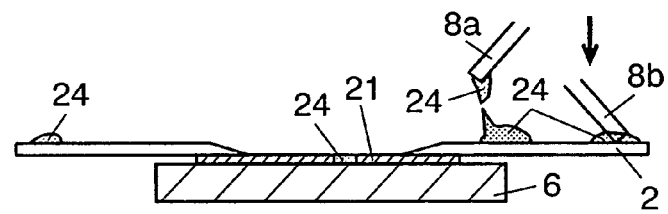
Figure 5E:
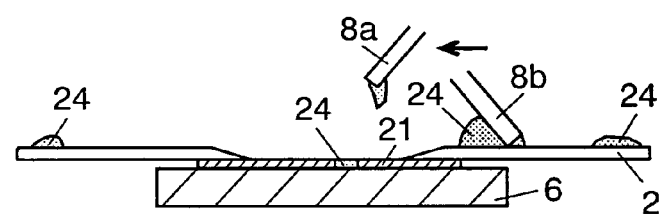
Figure 5F:
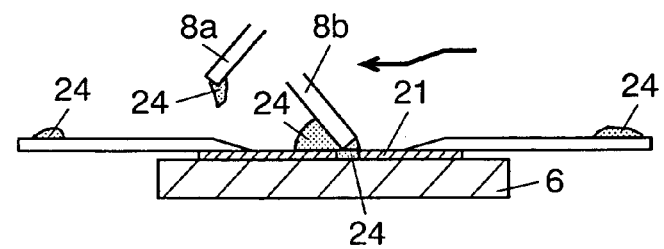
Figure 5G:
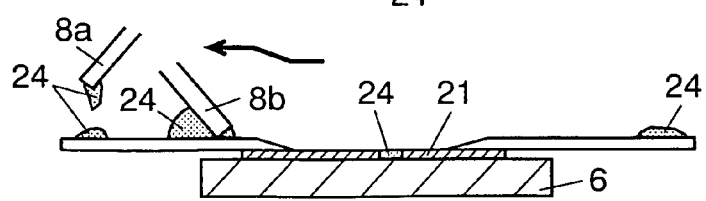
Figure 6:
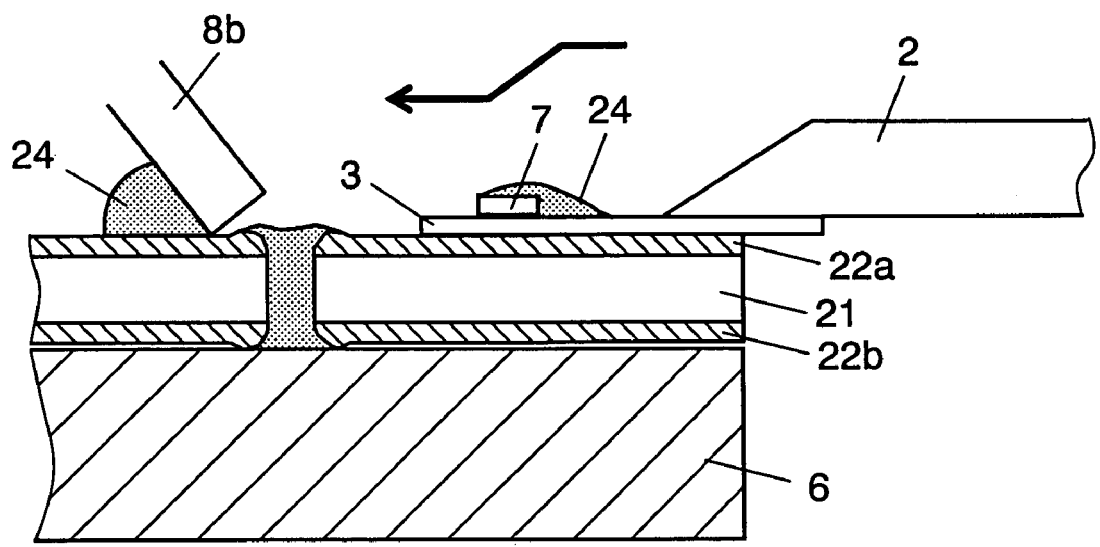
FIG. 6 is a cross-sectional view of a part of printed board which is being filled with paste by using the printing plate according to the present invention.

FIG. 5 shows cross-sectional views of a printed board, illustrating the production steps for filling it with paste by a squeegeeing method according to the present invention, and FIG. 6 is a cross-sectional view of a part of the printed board which is being filled with the paste by using the printing plate according to this invention. Here, like reference numerals are used throughout to designate like structural elements and like components as those described in the "Background Art" section, and their detailed description is omitted.

In the printing plate according to this invention, mask 2 made of an approx. 3 mm thick stainless steel is mounted to plate framework 1. Mask 2 has opening 4 measuring 250 mm by 450 mm, for instance, which is larger than a paste-filling area of prepreg sheet 21, as shown in FIG. 1 and FIG. 2 (in this instance, exclusive mask films are disposed to prepreg sheet 21 of 300 mm by 500 mm and approx. 150 μm in thickness).

Mask 2 is provided with slanting areas 5 in opening 4 at two ends intersecting a moving direction of a squeegee, i.e., the direction of two short sides of opening 4, in order to facilitate a sweeping movement of the squeegee. Slanting areas 5 have a slant angle set to approx. 15 degrees. Metal sheets 3 are fixed with adhesive or the like material to respective positions on back surfaces of the slanting areas 5 and two other sides of the opening in a manner so that they extend by approx. 5 mm from the respective sides.

Squeegee cleaning section 7 is formed at a predetermined location on the upper surface of approx. 100 μm thick metal sheet 3 extending from the back surface of slanting area 5 of mask 2. Squeegee cleaning section 7 comprises any of a linearly shaped projection of approx. 40 μm high as depicted in FIG. 3A to FIG. 3C and projections formed into approx. 40 μm high and 300 μm diameter with approx. 500 μm pitches in a zigzag pattern of 500 μm wide as depicted in FIG. 4A to FIG. 4C.

In this first exemplary embodiment, although the projections in squeegee cleaning section 7 were described as being approx. 40 μm high, it was confirmed that they can be 3 μm or higher to give an equivalent effectiveness. It is especially desirable that the projections have a height of 40 μm or less to avoid damages to the edge of the squeegee. We used an etching method and a molding method to form the linear projection, and the etching method for the projections of zigzag pattern.

Furthermore, it is desirable to use the etching or the like method to round edges of the projections in order to prevent the squeegee from being damaged.

When squeegee cleaning section 7 is formed with projections of the zigzag pattern, it is especially desirable that the individual projections are arranged at such pitches that they are flash or overlap with one another as shown in FIG. 4C. Moreover, although squeegee cleaning section 7 is formed only with the projections in the first exemplary embodiment, inside of these projections may be perforated individually with a through hole or un-penetrated hole.

Description is provided next of a method of filling conductive paste with reference to FIG. 5A through FIG. 5G. In preparation of filling through hole 23 with conductive paste 24, prepreg sheet 21 provided with mask films 22a and 22b (shown in FIG. 6, to be described later) and formed with through hole 23 is placed on stage 6 of a printing machine (not shown), and mask 2 is set on top of them, as shown in FIG. 5A.

Next, between two squeegees, i.e., moving-forth squeegee 8a and moving-back squeegees 8b disposed above mask 2 in a manner to move forward and backward freely and to pressurize vertically, moving-forth squeegee 8a is lowered to a predetermined position on mask 2 and it is moved forward while pushing a drop of conductive paste 24 to roll about with a pressure.

Moving-forth squeegee 8a is then advanced to pass over slanting area 5 of mask 2, and to reach on top of prepreg sheet 21, as shown in FIG. 5B. Both moving-forth squeegee 8a and moving-back squeegee 8b have the function of moving up and down freely while maintaining the pressure to prepreg sheet 21 according to their positions.

Subsequently, after moving-forth squeegee 8a sweeps over prepreg sheet 21 and another slanting area 5 (shown in FIGS. 1 and 2) and stops at another predetermined position on mask 2, it is raised and let conductive paste 24 drop naturally, as shown in FIG. 5C.

Next, only moving-back squeegee 8b is lowered to a predetermined position on mask 2 as shown in FIG. 5D.

Afterwards, moving-back squeegee 8b is moved to sweep over mask 2 and prepreg sheet 21 in the like manner as moving-forth squeegee 8a, as shown in FIG. 5E to FIG. 5G, and this completes the filling of through holes 23 with conductive paste 24.

According to the present invention, the printing plate is provided with metal sheets 3 extending from the back surfaces of slanting areas 5 of mask 2, and that one of metal sheets 3 located at the start side of moving-back squeegee 8b has squeegee cleaning section 7 comprised of a projection formed at a predetermined location on the upper surface thereof. Here, the start side of moving-back squeegee 8b defines one side of mask 2 from which squeegee 8b begins its forward movement while rolling about the drop of conductive paste 24.

FIG. 6 is a partial sectional view showing the middle of the process in which moving-back squeegee 8b started above mask 2 has advanced to a point beyond through hole 23 in the product after having passes through slanting area 5 and squeegee cleaning section 7 on metal sheet 3.

It was confirmed that an appreciable amount of conductive paste 24 removed from moving-back squeegee 8b is retained by the edge of the projection, or squeegee cleaning section 7 next to slanting area 5 of mask 2, when moving-back squeegee 8b has passed through slanting area 5 and squeegee cleaning section 7 after the start of the filling process.

A distance from slanting area 5 of mask 2 to squeegee cleaning section 7 is so determined as to provide a sufficient space for moving-back squeegee 8b to restore the original shape after it is deformed when being lowered along the surface of slanting area 5. Alternatively, a traveling speed of squeegee 8b may be slowed, or it is stopped once and restarted with a normal speed for the filling process after squeegee 8b has regained its original shape from the deformation.

In the first exemplary embodiment, the filling process was carried out by providing a pause period of approx. one second before squeegee 8b is advanced toward squeegee cleaning section 7.

We also found that any amount of conductive paste 24 left remained behind squeegee cleaning section 7 is removed by moving-forth squeegee 8a when another prepreg sheet 21 is set for the subsequent filling process, and it thus exhibited continuous effect of the cleaning capability. In other words, it was confirmed that like cleaning effect exists in the continuous filling and printing processes in which prepreg sheet 21 is filled and printed with conductive paste 24 and transferred, new prepreg sheet 21 is placed on the printing machine (not show in the figures), and it is filled and printed with conductive paste 24 again in the sane manner.

In addition, there was no flaw such as undesired remnants of paste left on any of the through holes as a result of confirmation on 100 pieces of prepreg sheets 21 of which the through holes are filled with conductive paste 24 after having squeegee 8b sweep over squeegee cleaning section 7. Confirmation was made further that no undesirable amount of conductive paste 24 has been transferred to mask films 22a and 22b so that removal of mask films 22a and 22b has not caused adverse influence to the quality.

Second Exemplary Embodiment

Description is provided hereinafter of a method of manufacturing a printed board according to the present invention.

Figure 7:
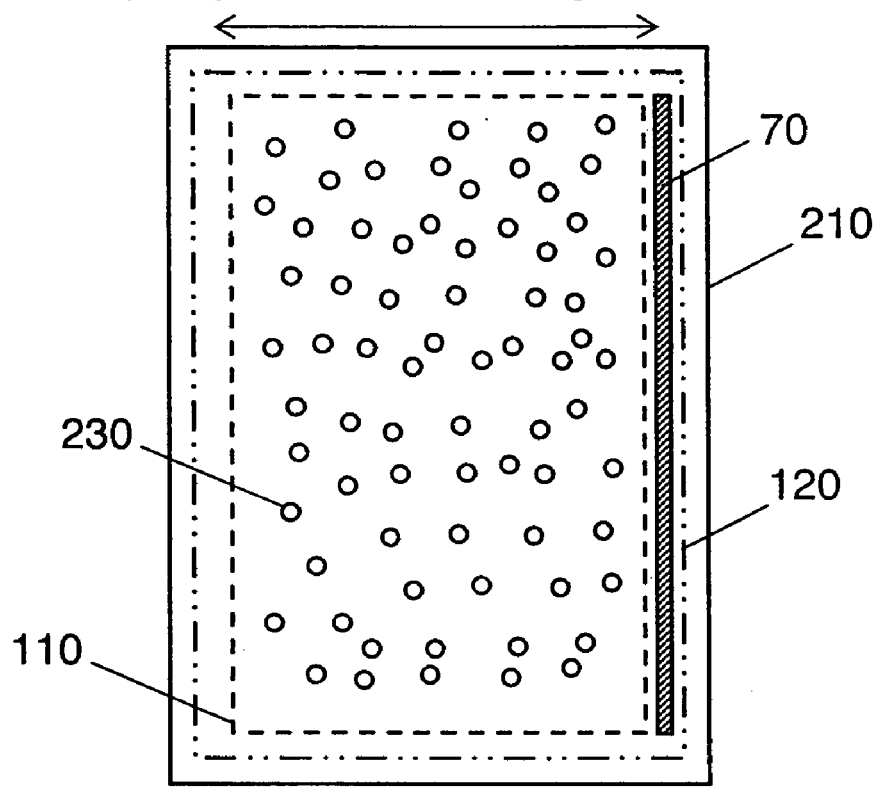
FIG. 7 is a plan view of a first printed board according to the present invention.
Figure 8:
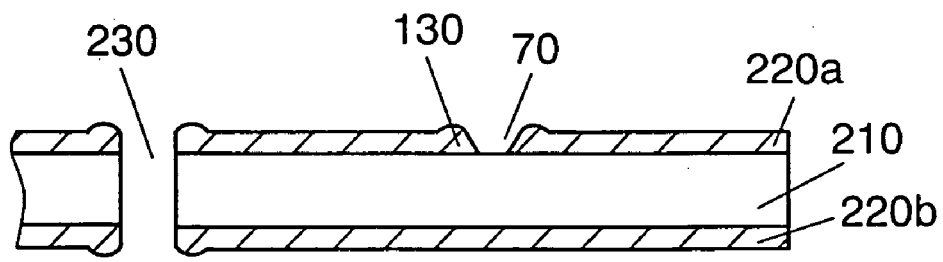
FIG. 8 is a sectional view of a part of the first printed board according to the present invention.

FIG. 7 is a plan view of a first printed board according to the present invention, and FIG. 8 is a sectional view of a part of the first printed board according to the present invention.

Figure 9:
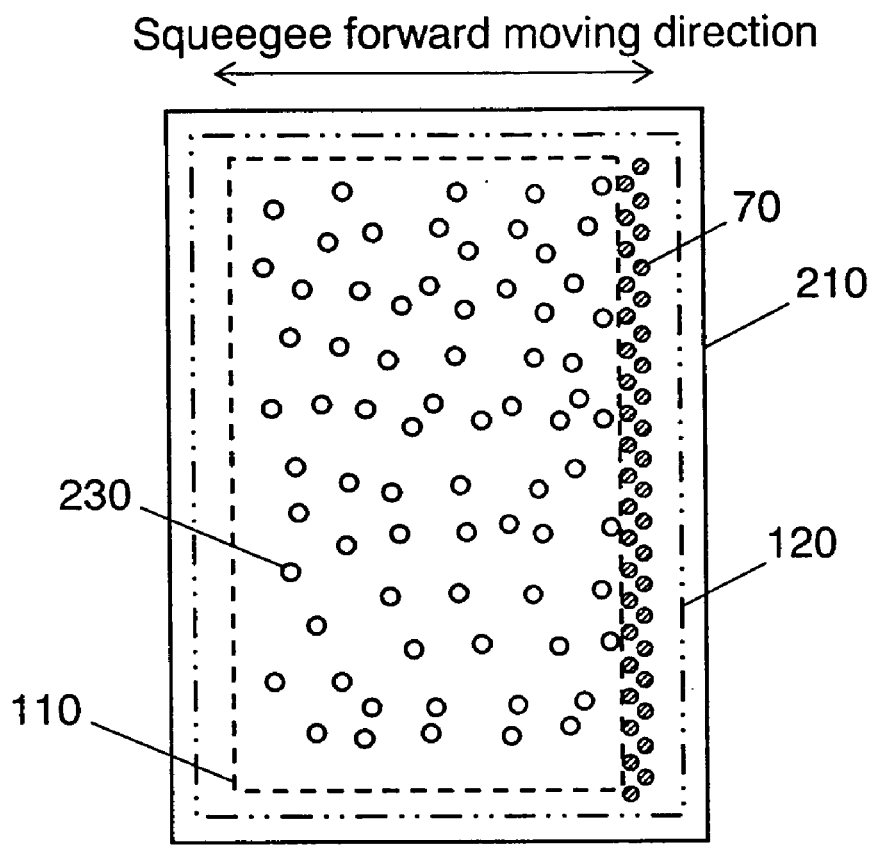
FIG. 9 is a plan view of a second printed board according to the present invention.
Figure 10:
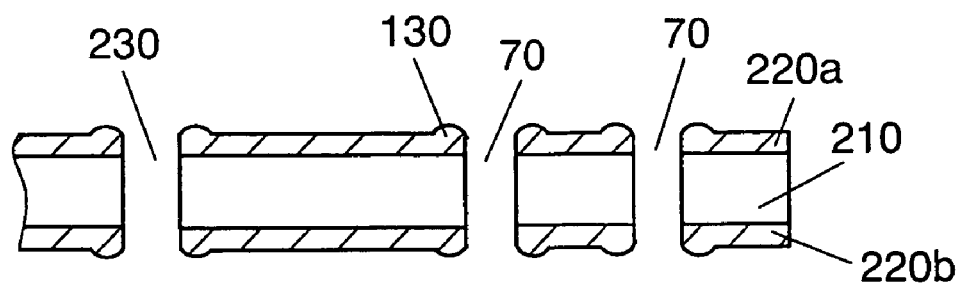
FIG. 10 is a sectional view of a part of the second printed board according to the present invention.
Figure 11:
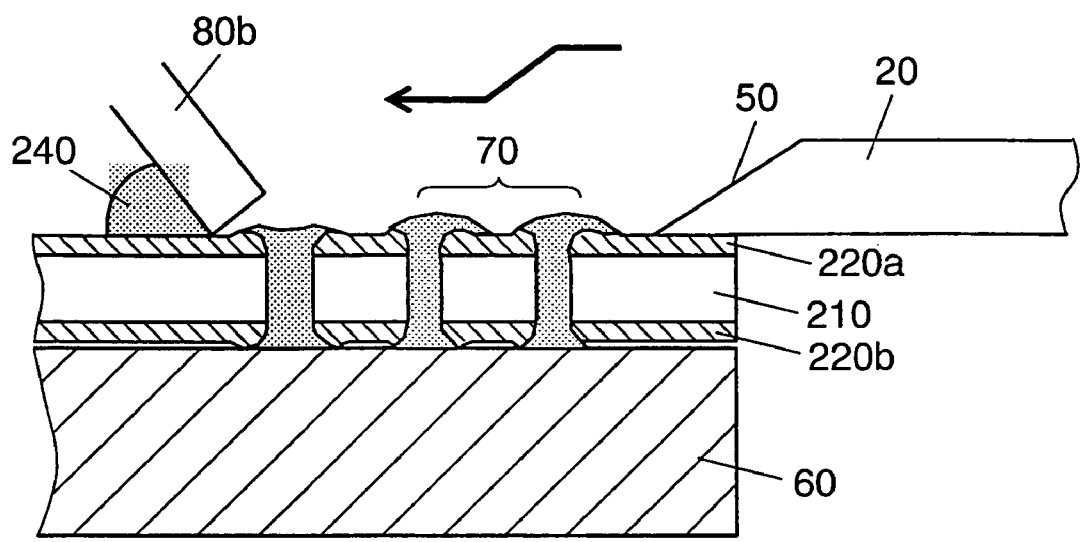
FIG. 11 is a cross-sectional view of a part of the second printed board which is being filled with paste according to the present invention.

FIG. 9 is a plan view of a second printed board according to the present invention, FIG. 10 a sectional view of a part of the second printed board according to the present invention, and FIG. 11 a cross-sectional view of a part of the second printed board which is being filled with paste according to the present invention.

In FIG. 7 through FIG. 10, prepreg sheet 210 has a size of approximately 300 mm by 500 mm and a thickness of approx. 150 μm. A board material used for prepreg sheet 210 is a composite prepared by having an unwoven fabric formed of all-aromatic polyamide fibers impregnated with a thermosetting epoxy resin. Mask films 220a and 220b are made of such material as polyethylene terephthalate having a thickness of about 16 μm and a width of 300 mm.

Prepreg sheet 210 is provided with through holes 230 formed in predetermined positions of product area 110, and squeegee cleaning section 70 along one side at the outside of product area 110 but inside of paste filling area 120.

At least one squeegee cleaning section 70 needs to be provided along one side of prepreg sheet 210 where one of the squeegees starts the last movement, but it may instead be located along the opposite side.

Squeegee cleaning section 70 provided in this second exemplary embodiment comprises any of the linearly shaped un-penetrated groove as depicted in FIG. 7 and through holes of zigzag pattern as depicted in FIG. 9 formed by laser beam machining at the same time with through holes 230 of the product. However, they may be either un-penetrated or penetrated in shape. Furthermore, it is desirable that mask film 220a has raised brims (protruding portions) 130 of 3 μm or greater in height around the processed holes and groove, regardless of their shape. The effectiveness of removing paste adhering to the edge of the squeegee decreases if the raised brims 130 are 3 μm or less in height. The edge of the squeegee here means a leading edge (sharp corner) of the squeegee, and it is a portion of moving-back squeegee 80b which comes in contact with mask film 220a in the instance of FIG. 11.

Figure 12:
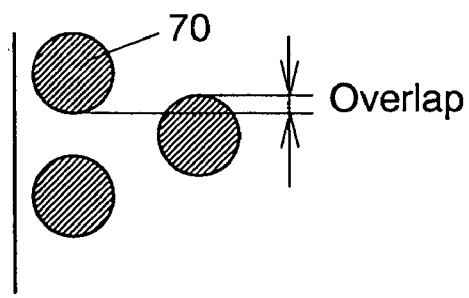
FIG. 12 is an enlarged illustration detailing a part of the second printed board according to the present invention.
Figure 13A:
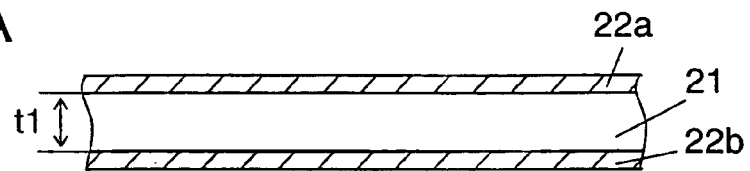
FIG. 13A through FIG. 13F are cross-sectional views of a two-sided printed board showing the production steps in the conventional manufacturing method.
Figure 13B:
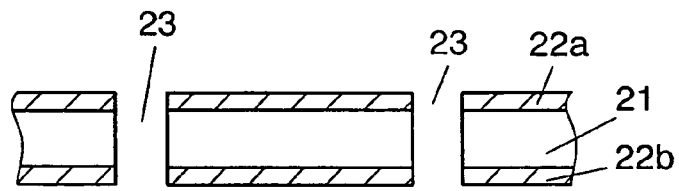
Figure 13C:
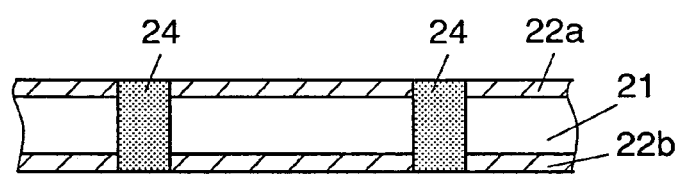
Figure 13D:
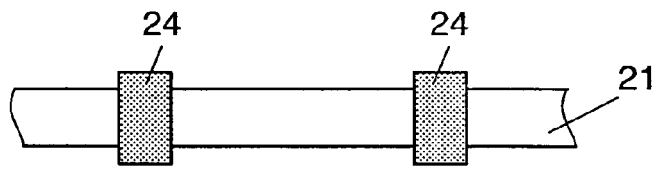
Figure 13E:
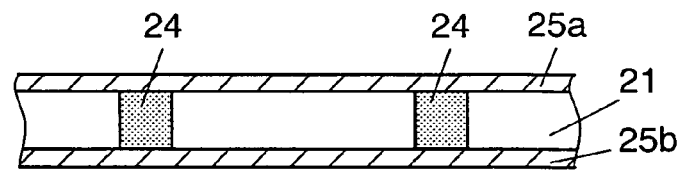
Figure 13F:
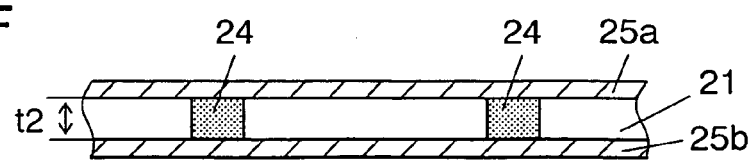
Figure 14:
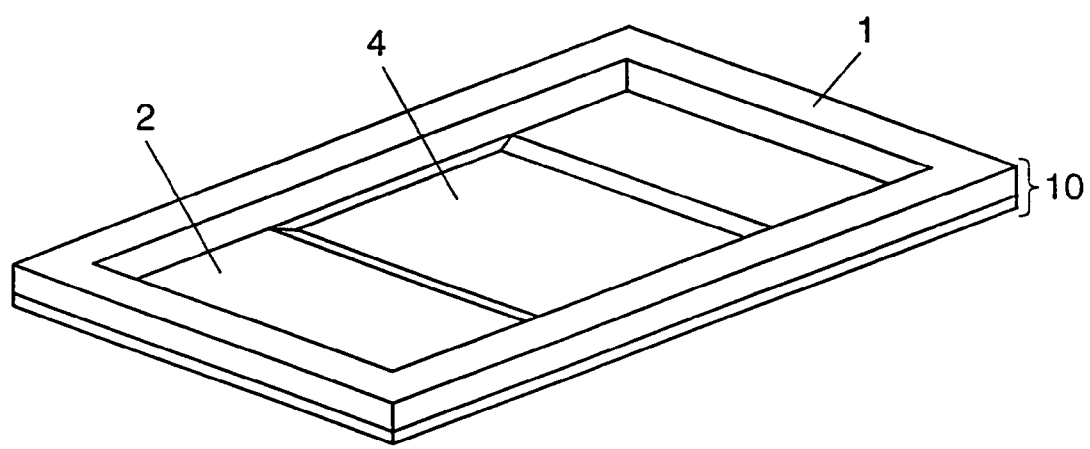
FIG. 14 is a perspective view showing a plate framework of the prior art provided with a mask having an opening.
Figure 15:
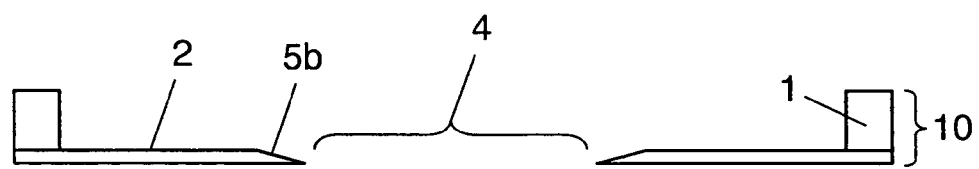
FIG. 15 is a longitudinal sectional view of the plate framework provided with the mask having the opening.
Figure 16A:
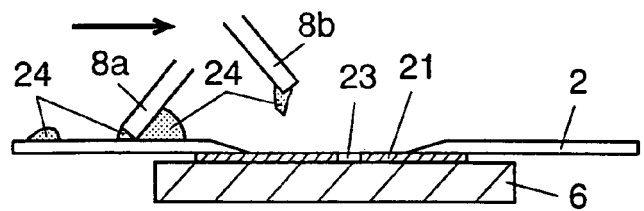
FIG. 16A through FIG. 16G are cross-sectional views of a prepreg sheet showing the production steps for filling it with paste with the squeegeeing method.
Figure 16B:
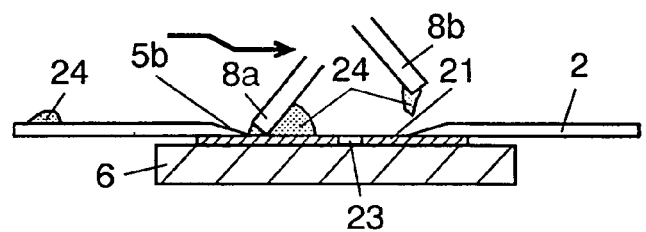
Figure 16C:
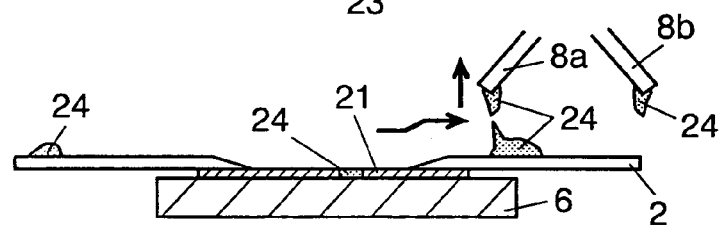
Figure 16D:
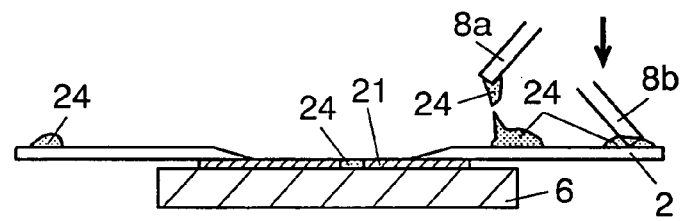
Figure 16E:
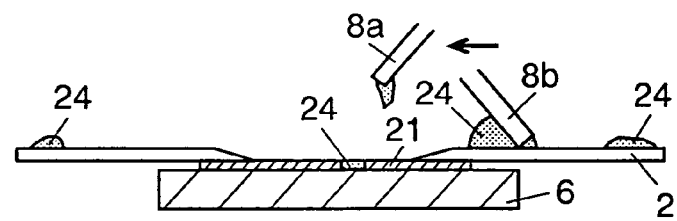
Figure 16F:
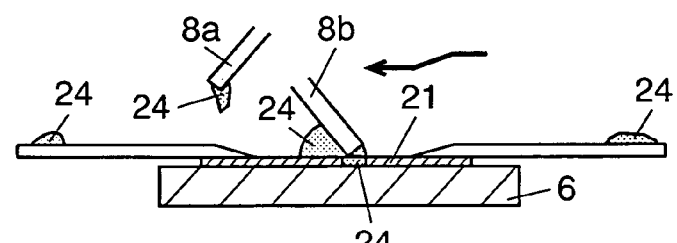
Figure 16G:
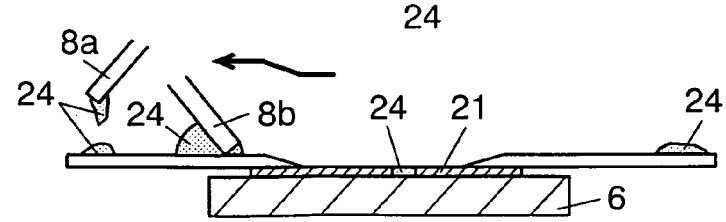
Figure 17:
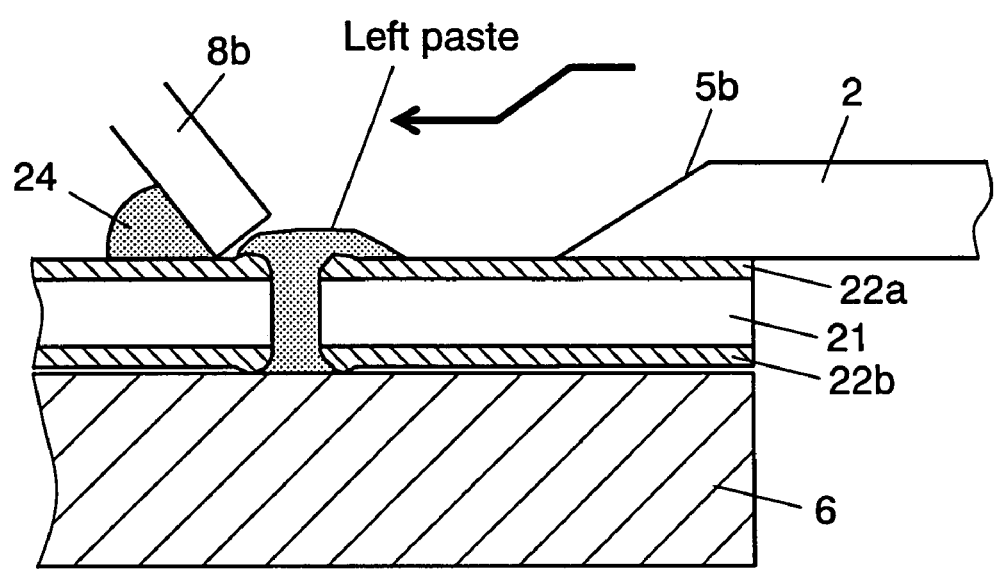
FIG. 17 is a cross-sectional view of a part of printed board of the prior art which is being filled with paste.

When squeegee cleaning section 70 is formed into a zigzag pattern, it is desirable that the individual holes are arranged at such pitches that they are flash or overlap with one another as shown in FIG. 12. The above structure can thus remove completely the paste adhering to the entire area of the squeegee.

In the present invention, through holes 230 in the printed board are filled with paste by the same method as that used in the prior art example, and details of it will therefore be omitted. Description is given here of unique features and advantages in the filling process of this invention with reference to FIG. 11.

FIG. 11 is a partial sectional view showing the middle of the process in which moving-back squeegee 80b started above mask 20 has advanced to a point beyond through holes 230 in the product after having passes through zigzag patterned squeegee cleaning section 70 formed of through holes.

It was confirmed that an appreciable amount of conductive paste 240 removed from moving-back squeegee 80b is retained by all of the zigzag patterned through holes of squeegee cleaning section 70 provided in prepreg sheet 210 at the side next to opening edge 50 of mask 20, when moving-back squeegee 8b has passed through opening edge 50 and squeegee cleaning section 70.

In addition, there were not undesired remnants of paste left on any through holes 230 as a result of confirmation on 100 pieces of prepreg sheets 210 of which through holes 230 are filled with conductive paste 240 after having squeegee 80b sweep over squeegee cleaning section 70. Confirmation was made further that no undesirable amount of conductive paste 240 has been transferred to mask films 220a and 220b so that removal of mask films 220a and 220b has not caused adverse influence to the quality.

When squeegee cleaning section 70 is formed into a zigzag pattern with through holes not overlapping with one another, it was still confirmed that substantial amount of conductive paste 240 removed from moving-back squeegee 80b is retained by all of the zigzag patterned through holes at the side next to opening edge 50 of mask 20 in the like manner as in the case of overlapping holes. However, it was found the through holes did not remove some portions of the paste in areas between the through holes, thereby leaving them on through holes 230 in the product.

Although the laser beam machining was used in the second exemplary embodiment to form the linear un-penetrated groove, it was verified that like effectiveness is attainable even when the un-penetrated groove is cut by a cutting blade which is easy to maintain and less expensive than the laser beam machining.

In the second exemplary embodiment, the board material used is the unwoven fabric containing the main component of aramid fibers formed into B-stage resin by impregnating it with a resin composed mainly of a thermosetting epoxy resin. However, like effectiveness can be attained even when the fabric is replaced by any of woven fabric of aramid fibers, woven or unwoven fabric of glass fibers, as needless to mention.

Resin materials composed mainly of aramid fibers and glass fibers are superior in thermal resistance as well as mechanical and physical properties, and the aramid fibers are especially advantageous for reduction in weight.

In addition, use of prepreg material of the B-stage resin realizes miniaturization of through holes 230 by the laser beam machining, and filling of the holes with conductive paste 240 can make them electrically conductive paths. Means disclosed in the present invention is especially useful for achieving stable electrical continuities in these connections.

In the second exemplary embodiment, squeegee cleaning section 70 was formed on the metal sheet by the etching method and the molding method, and squeegee cleaning section 70 of through holes or un-penetrated groove are formed in prepreg sheet 210 by the laser beam machining. However, like advantages are also readily considered achievable by forming a projection directly in a predetermined position on a metal sheet or prepreg sheet 210 with adhesive or the like, or by bonding any other object of a sheet-like or a projection-like material directly to it.

INDUSTRIAL APPLICABILITY

A printing plate, printed board and a printing method of the present invention use a squeegee cleaning section formed on the printing plate to remove paste of high viscosity built up on an edge of a squeegee before a through hole in the printed board is filled with the paste. This method can thus prevent the paste of high viscosity from being left on the through hole of the product, thereby having an advantage of providing the printed board with outstanding quality.

The invention claimed is:

1. A printing plate comprising:
   a plate framework with a frame-shaped opening for covering generally all or a part of an outer periphery of a board material;
   a mask secured to at least four sides of the plate framework, and provided with a slanting area at each of two sides of the opening corresponding the opposite ends of a moving direction of a squeegee; and
   metal sheets attached to respective locations on back surfaces of the slanting areas and two other sides of the opening in a manner to extend by a predetermined amount, wherein
   at least one of the metal sheets attached to one of the slanting areas is provided with a projection on an upper surface of the extended portion thereof.

2. The printing plate according to claim 1, wherein the projection on the metal sheet comprises a linearly formed projection having a predetermined length.

3. The printing plate according to claim 1, wherein the projection on the metal sheet comprises projections formed into a zigzag pattern having a predetermined length.

4. The printing plate according to claim 3, wherein the projections provided in the zigzag pattern on the metal sheet are arranged in a manner to overlap with one another.

5. The printing plate according to claim 1, wherein the projection is formed by etching the metal sheet.

6. The printing plate according to claim 1, wherein the projection is formed by die molding of the metal sheet.

7. The printing plate according to claim 1, wherein the projection is 3 μm or greater but 40 μm or smaller in height.

8. The printing plate according to claim 1, wherein the slanting area has a slant angle of 15 degrees.

9. The printing plate according to claim 1, wherein the projection has rounded edge.

10. A method of printing paste on a material to be printed by using the printing plate of claim 1 and by reciprocating a squeegee, wherein
    the method comprises the step of removing paste adhering to an edge of the squeegee by using a projection formed on the printing plate before start of the printing.

11. The method of printing according to claim 10, further comprising the step of stopping the squeegee for a predetermined time period prior to reaching the projection on the printing plate.

12. A printed board comprising:
    a board material having mask films on both surfaces thereof, and through holes filled with conductive paste by squeegeeing method; and
    a squeegee cleaning section formed in a predetermined location in an unusable portion inside of or the outside of a product area but within a printable space of the board material.

13. The printed board according to claim 12, wherein the squeegee cleaning section is formed outside of the through holes in the product area of the board material.

14. The printed board according to claim 12, wherein the squeegee cleaning section comprises through holes of a zigzag pattern.

15. The printed board according to claim 12, wherein the squeegee cleaning section comprises any of un-penetrated holes and an un-penetrated groove provided on a surface of the board material to be filled with the paste.

16. The printed board according to claim 12, wherein the squeegee cleaning section comprises a linearly shaped un-penetrated groove provided on a surface of the board material to be filled with the paste.

17. The printed board according to one of claim 12 through claim 16, wherein the mask film has a raised brim around the squeegee cleaning section.

18. The printed board according to one of claim 14 and claim 15, wherein the through holes and the un-penetrated holes are processed by using laser beam machining.

19. The printed board according to one of claim 15 and claim 16, wherein the un-penetrated groove is processed by using a cutting blade.

20. The printed board according to claim 12, wherein the board material comprises a prepreg material containing any of woven fabric and unwoven fabric formed into B-stage resin by impregnation with a resin material comprised mainly of a thermosetting resin.

21. The printed board according to claim 20, wherein the woven fabric and the unwoven fabric contain a main component of aramid fibers.

22. The printed board according to claim 20, wherein the woven fabric and the unwoven fabric contain a main component of glass fibers.

23. The printed board according to one of claim 14 and claim 15, wherein the through holes and the un-penetrated holes of zigzag pattern are arranged at such pitches that the individual holes are flash or overlap with one another.

24. The printed board according to claim 17, wherein the raised brim has a height of at least 3 μm.

25. A method of printing paste on the a material of the printed board of claim 12 by reciprocating a squeegee, wherein
    the method comprises the step of cleaning an edge of the squeegee by a squeegee cleaning section provided on the printed board before start of the printing.

* * * * *